(12) United States Patent
Bains et al.

(10) Patent No.: US 7,432,731 B2
(45) Date of Patent: Oct. 7, 2008

(54) METHOD AND APPARATUS TO CALIBRATE DRAM ON RESISTANCE (RON) AND ON-DIE TERMINATION (ODT) VALUES OVER PROCESS, VOLTAGE AND TEMPERATURE (PVT) VARIATIONS

(75) Inventors: Kuljit S. Bains, Olympia, WA (US); Navneet Dour, Folsom, CA (US); Hany Fahmy, Elk Grove, CA (US); George Vergis, Hillsboro, OR (US); Christopher E. Cox, Placerville, CA (US)

(73) Assignee: Intel Corporation, Santa Clara, CA (US)

( * ) Notice: Subject to any disclaimer, the term of this patent is extended or adjusted under 35 U.S.C. 154(b) by 75 days.

(21) Appl. No.: 11/174,009

(22) Filed: Jun. 30, 2005

(65) Prior Publication Data

US 2007/0007992 A1    Jan. 11, 2007

(51) Int. Cl.
*H03K 17/16* (2006.01)
*H03K 19/003* (2006.01)
(52) U.S. Cl. .......................................... 326/30; 326/56
(58) Field of Classification Search ................. 326/30, 326/82, 83, 86, 56–58; 327/261
See application file for complete search history.

(56) References Cited

U.S. PATENT DOCUMENTS

| | | | | |
|---|---|---|---|---|
| 6,333,639 | B1 * | 12/2001 | Lee | 326/30 |
| 6,343,352 | B1 * | 1/2002 | Davis et al. | 711/158 |
| 6,586,964 | B1 * | 7/2003 | Kent et al. | 326/30 |
| 7,020,818 | B2 * | 3/2006 | Dour et al. | 714/724 |
| 7,106,638 | B2 * | 9/2006 | Martin | 365/198 |
| 7,176,711 | B2 * | 2/2007 | Park et al. | 326/30 |
| 2004/0189343 | A1 * | 9/2004 | Jang | 326/30 |
| 2005/0144372 | A1 * | 6/2005 | Walker | 711/105 |
| 2006/0053243 | A1 * | 3/2006 | David et al. | 710/305 |
| 2006/0092715 | A1 * | 5/2006 | Braun et al. | 365/189.05 |

\* cited by examiner

*Primary Examiner*—Rexford Barnie
*Assistant Examiner*—Crystal L Hammond
(74) *Attorney, Agent, or Firm*—Blakely, Sokoloff, Taylor & Zafman LLP

(57) ABSTRACT

An embodiment may comprise memory with a memory array, a resistor coupled to a reference voltage, on die termination circuitry coupled with the resistor, and an input coupled to the on die termination circuitry and coupled with the memory array, the input to receive a calibration command to stop use of the input and the memory array and calibrate the on die termination circuitry with the resistor coupled to the reference voltage. Other embodiments are disclosed herein.

14 Claims, 6 Drawing Sheets

| Function | CKE | | CS# | RAS# | CAS# | WE# | BA3-BA0 | A15-A13 | A12 | A10 | A11, A9-A0 |
|---|---|---|---|---|---|---|---|---|---|---|---|
| | Prev cycle | Current cycle | | | | | | | | | |
| ZQ calibration long (ZQCL) | H | H | L | H | H | L | X | X | X | 1 | X |
| ZQ calibration short (ZQCS) | H | H | L | H | H | L | X | X | X | 0 | X |

FIG. 1

| Symbol | DDR3 800/1066/1333/1600 | |
|---|---|---|
| | min | max |
| tZQCL | 25 0 tCK | N/A |
| tZQCS | 64 tCK | N/A |

FIG. 2

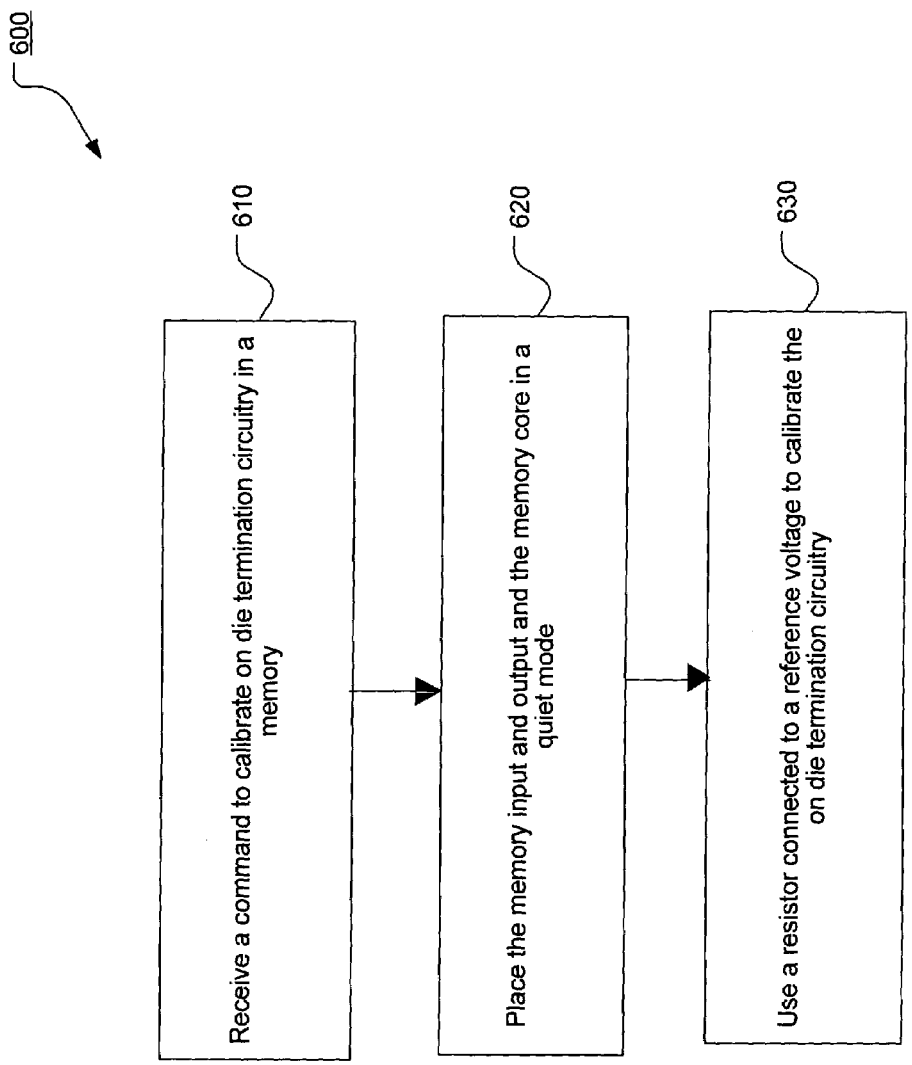

METHOD AND APPARATUS TO CALIBRATE DRAM ON RESISTANCE (RON) AND ON-DIE TERMINATION (ODT) VALUES OVER PROCESS, VOLTAGE AND TEMPERATURE (PVT) VARIATIONS

BACKGROUND

Integrated circuit technologies continue to evolve. Computing and communications designs are incorporating more functionality, higher processing and transmission speeds, smaller feature sizes, more memory, etc., into smaller and more robust architectures.

Semiconductor memories in particular are evolving at a rapid pace. Memory devices have reduced power requirements, increased capacities, increased operating frequencies, reduced latencies, etc., all while ramping with the exponential density increases according to Moore's Law.

The increased frequencies of memory devices have necessitated greater bandwidth between the memory devices and memory controllers. Prior memory systems, such as the initial double data rate (DDR) DRAMs, often had multi-drop bus architectures that were terminated with a resistor on the motherboard the bus resided on. With subsequent generations of memory such as DDR2 and GDDR3, the termination resistor was moved on die with the memory to improve the signal integrity for these high frequency systems.

Transistors often display process variations even on the same integrated circuit. In MOS transistors, for example, process variations may occur in impurity concentration densities, oxide thicknesses, diffusion depths, or generally by variations during diffusion of impurities or during deposition. Process variations cause transistor parameters to vary. Other variations often exist due to voltage or temperature drifts during operation. In combination, process, voltage and temperature (PVT) variations affect integrated circuit performance.

DDR2 memory systems would calibrate on die termination resistors during power up and compensate for process variations. DDR2 memory systems also provided off-chip driver (OCD) calibrations to reduce mismatch between pull-up and pull-down output driver characteristics, further improving timing margins in the memory. Signaling was not sufficiently fast in DDR2 systems to require a compensation for voltage and temperature variations. DDR2 systems would either not calibrate at all to account for process variations or would calibrate once during initialization.

In GDDR3 graphics devices, calibration is done during auto-refresh operations to compensate for voltage and temperature variations. In these GDDR3 calibrations, a memory controller initiates a refresh cycle in the DRAM.

In a refresh cycle, charge loss in memory cells is compensated for by periodically rewriting the cell contents. Refresh operations consist of a read of memory cell contents followed by rewriting the cell contents. This refresh operation is why DRAMs are called dynamic RAMs.

Refresh operations take a relatively long time in DRAM cycles, currently in the area of 200 nanoseconds to 400 nanoseconds. In GDDR3 memory systems, the DRAM could run a hidden calibration in the background during refresh. However, calibrations run during refresh are not very accurate due to significant signal noise on the DRAM device from the refresh operation while the device opens several rows and writes them back to refresh cells in the memory.

What is needed is an improved method and apparatus to more effectively calibrate termination and drive circuitry to account for process voltage and temperature variations.

BRIEF DESCRIPTION OF THE DRAWINGS

Embodiments of the invention may be best understood by reading the disclosure with reference to the drawings, wherein:

FIG. 1 illustrates a command truth table for on die termination and driver on resistance calibration using a ZQ pin in a DRAM.

FIG. 2 illustrates timing parameters for calibration commands for on die termination and drivers for memories.

FIG. 6 illustrates a flow diagram of a method for calibrating on die termination and driver resistance values.

DETAILED DESCRIPTION

Figure 3:
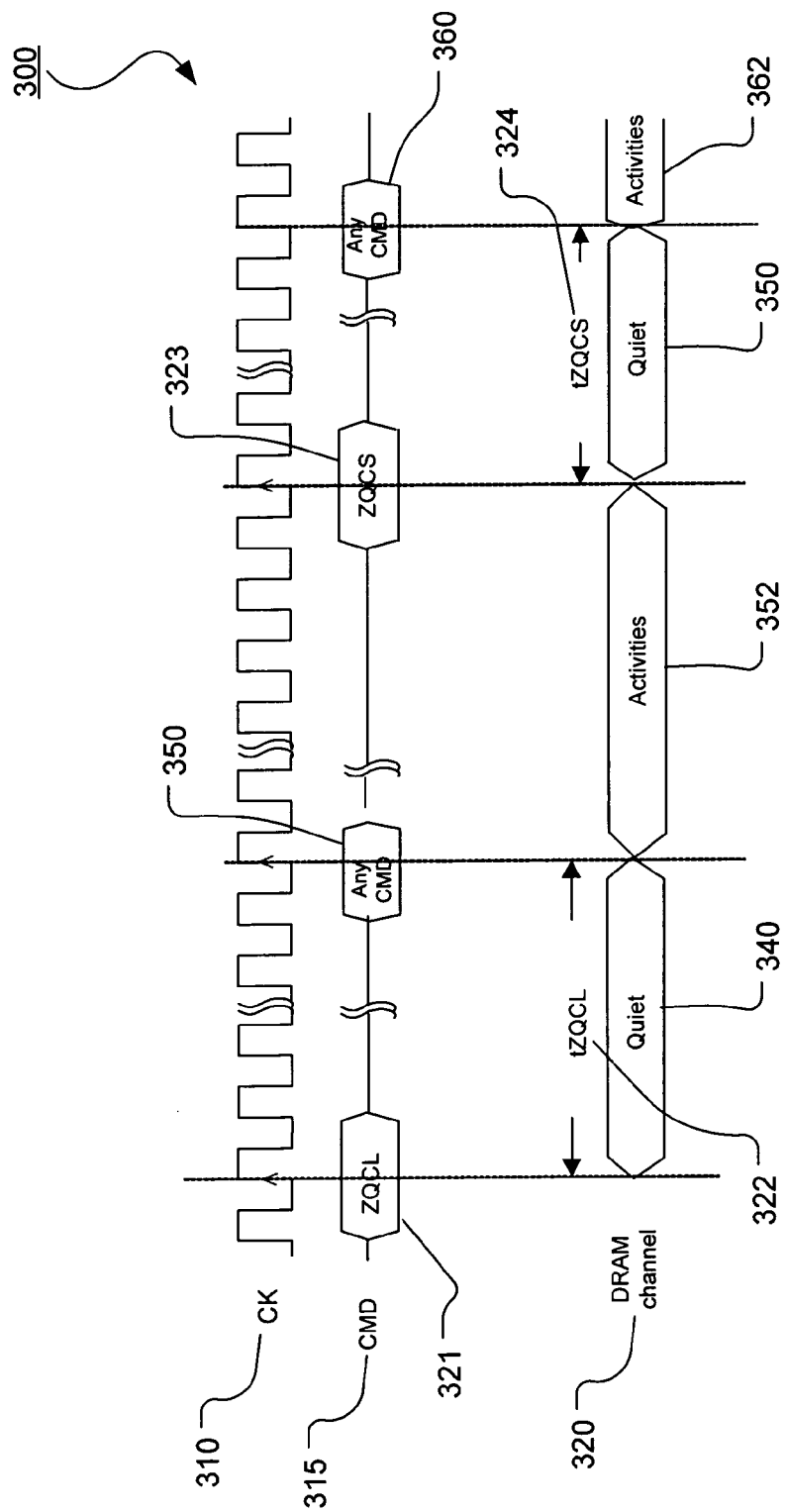
FIG. 3 illustrates a timing diagram for on die termination and driver on resistance calibration in a DRAM.

In the following description, numerous specific details are set forth. However, it is understood that embodiments of the invention may be practiced without these specific details. In other instances, well-known circuits, structures, and techniques have not been shown in detail in order to not obscure the understanding of this description.

Reference in the specification to "one embodiment" or "an embodiment", etc., means that a particular feature, structure, or characteristic described in connection with the embodiment is included in at least one aspect of the invention. The appearances of the phrase "in one embodiment" in various places in the specification do not necessarily all refer to the same embodiment.

Embodiments may provide a method or apparatus to calibrate on die termination and driver circuitry to reduce the impact of PVT variations in memories. Memory input and output and memory cores can be set in a quiet mode to reduce noise and provide a more accurate calibration.

Calibrations may be conducted using a pin on a memory device, such as a ZQ pin coupled with a resistor to a reference voltage. In some embodiments the reference voltage is a ground voltage. In some cases a ZQ pin can be shared between memory devices due to a memory controller initiating the calibration, therefore multiple memory devices will not simultaneously try to use the same ZQ pin and degrade the calibration.

Some embodiments may provide for a longer calibration at the memory initialization and a shorter calibration after initialization. Both calibrations may calibrate for voltage and temperature variations, but in the present example the longer calibration may be used to compensate for process variations which will remain consistent before and after initialization. Either calibration may be issued by a calibration command at any time, for example by a memory controller coupled with the memory devices.

In some embodiments a memory controller may be in a separate chipset, may be integrated into a chip that includes on or more processors, or may simply be any circuitry functional to control memory, but is no so limited to any architecture but may be any circuitry or software that controls memory devices, even if resident on the memory devices. Other embodiments may have circuitry, for example a buffer, in between memory and the memory controller.

FIG. 1 illustrates a command truth table for on die termination and driver on resistance calibration using a ZQ pin in a DRAM. FIG. 1 shows a command for a long calibration, in this example ZQCL, and a command for a short calibration, in this example ZQCS are represented in the command truth table.

Referring to the ZQCL command in FIG. 1, a dynamic clock enable signal is show as logic high for a previous cycle and for the current cycle during a ZQCL command. Additionally, a chip select signal is set low, the address lines Row Address Strobe (RAS), Column Address Strobe (CAS) are set high, and the control line WE is set low.

In a ZQCL command an address pin may be set to logic level 1 to differentiate between different calibration commands, for example, A10 may be set to 1, as shown in FIG. 1.

The ZQCS command in FIG. 1, also has a dynamic clock enable signal is show as logic high for a previous cycle and for the current cycle during a ZQCL command. Likewise, in the current example the chip select signal is set low, the address lines Row Address Strobe (RAS), Column Address Strobe (CAS) are set high, and the control line WE is set low.

In a ZQCS command an address pin may be set to logic level 0 to differentiate between different calibration commands, for example, A10 may be set to 0, as shown in FIG. 1.

FIG. 2 illustrates example timing parameters for calibration commands for on die termination and drivers for memories. In particular, example minimum times are shown for a time after each command happens, in this case, for a long calibration such as ZQCL, the symbol is tZQCL and for a short calibration such as ZQCS, tZQCS is used. The values used in the table are for example only, other values may be used, for example instead of 250 tCK, it may be 512tCK, or any other value so long as calibration can happen in the time allotted in similar fashion. Likewise, tZQCS may be a different time than that shown in FIG. 2.

FIG. 3 illustrates a timing diagram 300 for on die termination and driver on resistance calibration in a DRAM. The timing diagram 300 includes a clock signal 310, command signals 315 relative to the clock signals 310, and DRAM channel 320 activity level corresponding to the command signals 315 and clock signal 310.

In the present example, a ZQCL command 321 may be given which results in a quiet time 340 on the DRAM channel 320. In the present example the quiet time 340 is a period of tZQCL 322.

Next is shown any command 350 which is followed by activities 352 on the DRAM channel 320. In this case, any command 350 simply means any command other than a calibration command.

Process variations cause transistor parameters to vary. Other variations often exist due to voltage or temperature drifts during operation. In combination, process, voltage and temperature (PVT) variations affect integrated circuit performance.

During operation, an exemplary temperature drift is about two degrees per second. A memory controller may become aware of this drift and initiate a calibration. Similarly, if there is a voltage drift, a memory controller can do calibrations so the DRAM input and output (IO) cells are adjusted to perform within a certain range. A short calibration may be used for VT variations after initialization since process variations have already been accounted during a calibration at initialization.

Referring to FIG. 3, a short calibration command, in this case ZQCS 323 is given which results in a quiet time 340 on the DRAM channel. In this case the quiet time 340 is a period of tZQCL 322 since a short calibration ZQCS 323 was given. Again, this may be followed by any command 360 which again results in some activity on the DRAM channel. Similar to the ZQCL, any command 350 simply means any command other than a calibration command.

An embodiment may comprise a memory including a memory array, a resistor coupled to a reference voltage, on die termination circuitry coupled with the resistor, and an input coupled to the on die termination circuitry and coupled with the memory array, the input to receive a calibration command to stop use of the input and the memory array and calibrate the on die termination circuitry with the resistor coupled to the reference voltage. An example memory array is a DRAM array.

In an embodiment, the on die termination circuitry may be drive circuitry and the calibration may be of an on resistance value of the drive circuitry. Drive circuitry may be used when sending information from the memory off die, instead of terminating signals received by the memory.

In the present embodiment, the calibration command may be a ZQ calibration command and the resistor is a ZQ pin. Additionally, the calibration command may be sent during or after initialization of the memory, and may take into account PVT variations or any subset thereof.

Figure 4:
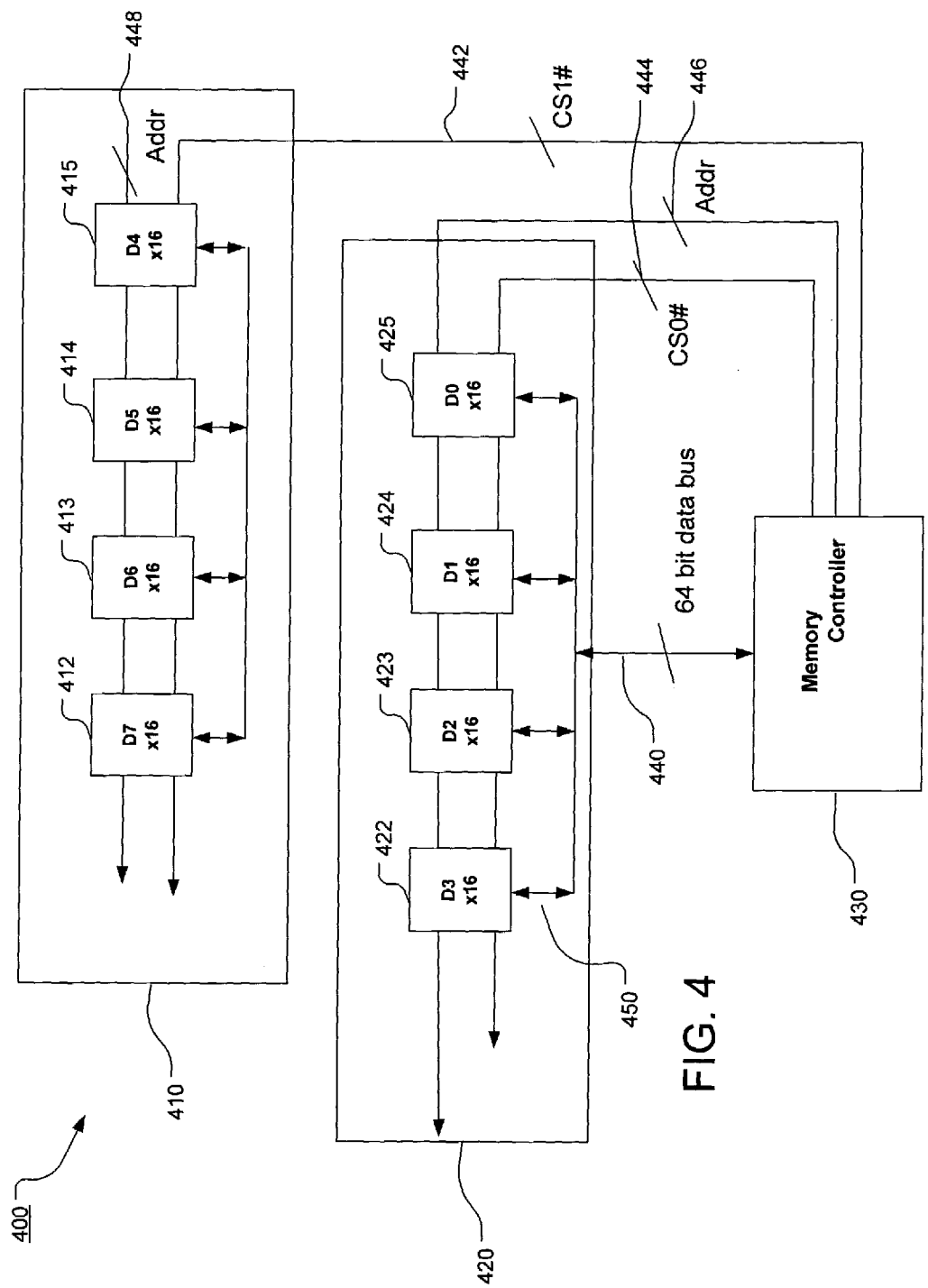
FIG. 4 illustrates a memory module with two ranks coupled with a memory controller in accordance with one embodiment.

FIG. 4 illustrates a typical memory system 400 comprising two ranks 410 and 420 of a dual inline memory module (DIMMS) of DRAMs, coupled with a memory controller 430 in accordance with an embodiment.

Referring to FIG. 4, memory controller 430 is coupled to rank 420 by data bus 440. In the present example data bus 440 is a 64 bit data bus, although it may be a serial or parallel architecture, and is not so limited to 64 bits. Additionally, memory controller 430 is shown coupled with rank 420 also with a chip select CSO# 444 and an address 446 bus. Memory controller is also coupled with rank 410. In a typical embodiment, only one data and address bus is coupled with the module and they are routed between ranks 420 and 410 (inter-rank coupling not shown).

Rank 420 is shown comprising 4 memory devices 422, 423, 424 and 425. In the present example these memory devices are DRAMs which are coupled with the data bus 440 by interconnects 450, which may be 16 bit interconnects, as an example. Memory devices 422, 423, 424 and 425 in rank 420 are also each coupled with CSO# 444 and Address bus 446.

Similar to rank 420, rank 410 is shown comprising 4 memory devices 412, 413, 414 and 415. In the present example these memory devices are DRAMs which are coupled with the data bus by interconnects, similar to how it is illustrated for rank 420. Likewise, memory devices 412, 413, 414 and 415 in rank 410 are each coupled with CS1# 444 and Address bus 448.

Referring to FIG. 4, the DIMM may have four local ZQ resistors coupled to a reference voltage, for example a ground. In the present example, one ZQ resistor may be shared between memory devices 425 and 415, another ZQ resistor may be shared by memory devices 424 and 414, etc.

In an embodiment, an example calibration may calibrate on die termination and driver values with the ZQ pin by calibrating one of the ranks, either 420 or 410, and then using the other rank using the same shared resistor. An example driver value is an On Resistance (Ron).

In an embodiment, the Ron may use "pull-up" legs of an IO cell where ODT may use both "pull-up" and "pull-down" legs. In this example Ron is used when a memory is driving data and ODT is used when a DRAM is receiving data. Different Ron values can be selected using a register in the memory, such as an extended mode register in a DRAM. Example Ron values may 40 Ohms in current architectures, but need not be so limited. Example ODT values are 60 and 120 Ohms, but again, this are relevant to conventional architectures and need not be so limited. Embodiments may use different values.

For example, different ODT and Ron values may be used for different loads, different numbers of DIMMs on a channel, and motherboard/controller requirements, as examples.

An embodiment may comprise a system including a processor, a display device in electrical communication with the processor, a memory controller coupled with the processor, and a memory coupled with the memory controller, the memory comprising a memory array, a resistor coupled to a reference voltage, on die termination circuitry coupled with the resistor, and an input coupled to the on die termination circuitry and coupled with the memory array, the input to receive a calibration command to stop use of the input and the memory array and calibrate the on die termination circuitry with the resistor coupled to the reference voltage. In an alternate embodiment, the on die termination circuitry may be the drive circuitry of the memory.

Yet another embodiment may comprise drive circuitry coupled with the memory array, the input to receive a calibration command to stop use of the input and the memory array and to calibrate the drive circuitry and the on die termination with the resistor coupled to the reference voltage.

In some embodiments, the calibration command may be a ZQ calibration command and the resistor is a ZQ pin.

Figure 5:
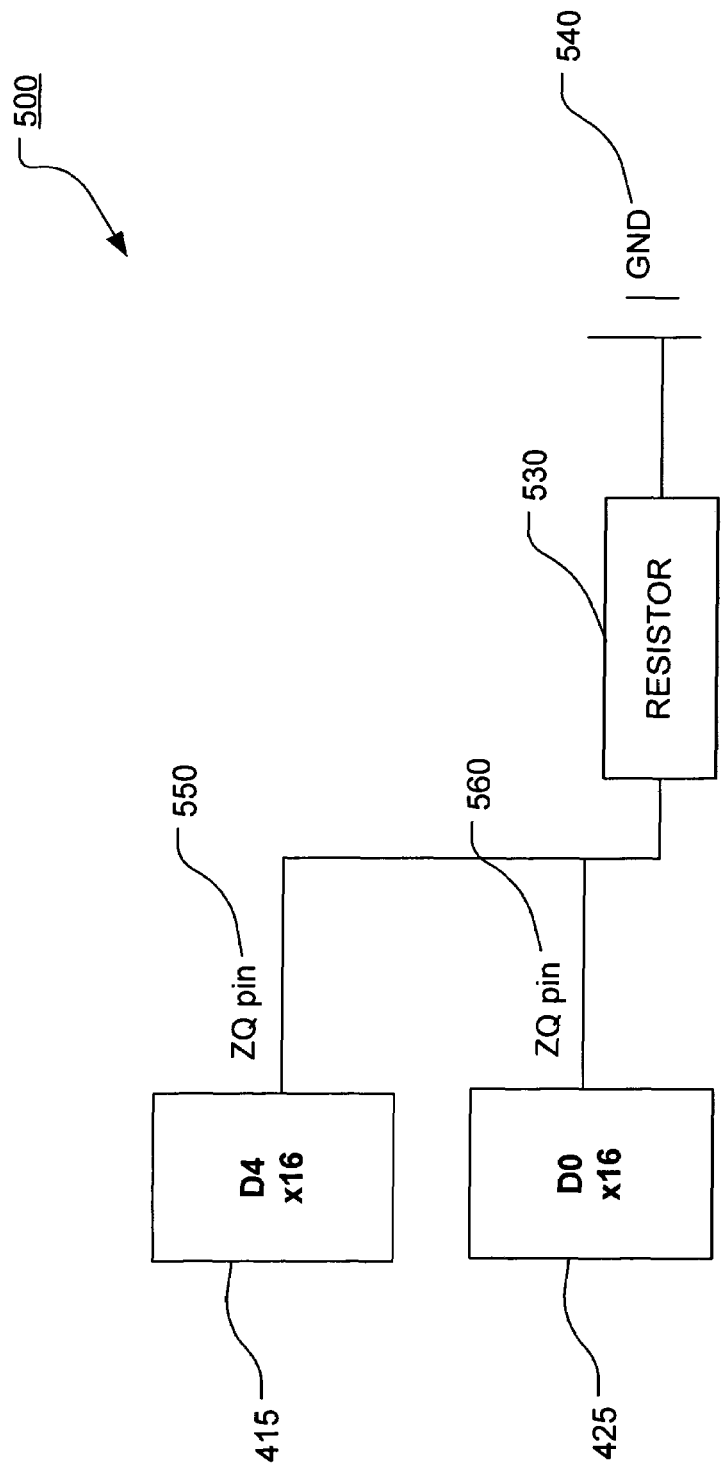
FIG. 5 illustrates two memory devices and a shared resistor to calibrate DRAM Ron and ODT values over PVT.

FIG. 5 illustrates an embodiment 500 with two memory devices 415 and 425, for example the memory devices illustrated in FIG. 4, and also illustrates a shared resistor 530 to calibrate DRAM Ron and ODT values over PVT.

Referring to FIG. 5, memory device 415 is coupled through ZQ pin 550 to resistor 530, while memory device 425 is coupled to the resistor 530 through ZQ pin 560. The resistor is then coupled to ground 540. In this example, two separate memory devices may use a similar resistor to a reference voltage to calibrate on die termination and driver resistance values.

In one embodiment this may be accomplished with a memory controller to coordinate calibration events for each of the memory devices 415 and 425 so the memory devices do not simultaneously attempt calibration.

An embodiment may use a ZQ calibration command to calibrate DRAM Ron & ODT values over PVT. There may be different ZQ calibration commands, for example, DDR3 SDRAM needs a longer time to calibrate Ron & ODT at initialization and relatively smaller time to perform periodic calibrations, and therefore two different commands could suit each condition.

In the present example, ZQCL command may be used to perform an initial calibration during power-up initialization sequence. This command may be issued at any time by the controller depending on the system environment. A ZQCL command can trigger a calibration engine inside a DRAM and once calibration is achieved the calibrated values are transferred from the calibration engine to DRAM IO which gets reflected as updated Ron & ODT values. DRAM is allowed a timing window, for example as shown in FIG. 3.

In the present example, a ZQCS command may then be used to perform periodic calibrations to account for VT variations. A shorter timing window is provided to perform the calibration and transfer of values as defined by timing parameter tZQCS. Likewise, an example timing window is shown in FIG. 3.

An embodiment may provide quiet time on the DRAM channel. In the present example, the quiet time may be provided by the controller for the duration of tZQCL or tZQCS. The quiet time on the DRAM channel helps in accurate calibration of Ron & ODT. Once DRAM calibration is achieved the DRAM can disable the ZQ current consumption path to reduce power.

In an embodiment, all banks should be precharged and tRP met before ZQCL or ZQCS commands are issued by the controller. In this example the ZQ calibration commands can also be issued in parallel to DLL lock time when coming out of self refresh. Additionally, in dual rank systems that share the ZQ resistor between devices, the controller should not allow overlap of tZQCL and tZQCS between ranks.

FIG. 6 illustrates a flow diagram of a method 600 for calibrating on die termination and driver resistance values. In block 610, a device can begin calibration by receiving a command to calibrate on die termination circuitry in a memory. In block 620, the method may then place the memory input and output and the memory core in a quiet mode. In block 630, the method uses a resistor connected to a reference voltage to calibrate the on die termination circuitry to compensate for at least one of a process, a voltage and a temperature variation. An example memory is a DRAM.

In an embodiment, the resistor connected to a reference voltage to calibrate the on die termination circuitry may be coupled to the memory by a ZQ pin. Another embodiment may comprise sending a calibration command during initialization of the memory or sending a calibration command after the memory is initialized.

The present invention may be embodied in other specific forms without departing from its spirit or essential characteristics. The described embodiments are to be considered in all respects only as illustrative instead of restrictive or limiting. Therefore, the scope of the invention is indicated by the appended claims rather than by the foregoing description. All changes, modifications, and alterations that come within the meaning, spirit, and range of equivalency of the claims are to be embraced as being within the scope of the appended claims.

The invention claimed is:

1. A memory comprising:
  a memory array;
  a resistor coupled to a reference voltage;
  on die termination circuitry coupled with the resistor; and
  an input coupled to the on die termination circuitry and coupled with the memory array, the input to receive a first calibration command to calibrate the on die termination circuitry, the first calibration command having an associated first calibration time window, and a second calibration command to calibrate the on die termination circuitry, the second calibration command having an associated second calibration time window, wherein the first calibration time window is greater than the second calibration time window, and further wherein the memory array is quiesced responsive, at least in part, to the first calibration command.

2. The memory of claim 1, wherein the memory array is a Dynamic Random Access Memory.

3. The memory of claim 1, wherein the first calibration command is a ZQ calibration command and the resistor is a ZQ pin.

4. The memory of claim 1, wherein the first calibration command is sent during initialization of the memory.

5. The memory of claim 1, wherein the second calibration command is sent after the memory is initialized.

6. A method comprising:
  receiving a first command to calibrate on die termination circuitry in a memory, the first command having an associated first calibration time window;

placing a memory input and an output and a memory core in a quiet mode;

using a resistor connected to a reference voltage to calibrate the on die termination circuitry to compensate for at least one of a process, a voltage and a temperature variation; and receiving a second command to calibrate on die termination circuitry in the memory, the second command having an associated second calibration time window, wherein the first calibration time window is greater than the second calibration time window.

7. The method of claim 6, wherein receiving a first command to calibrate on die termination circuitry in a memory is a command to calibrate a Dynamic Random Access Memory.

8. The method of claim 6, wherein using a resistor connected to a reference voltage to calibrate the on die termination circuitry uses a ZQ pin on the memory.

9. The method of claim 6, comprising sending the first calibration command during initialization of the memory.

10. The method of claim 6, comprising sending the second calibration command after the memory is initialized.

11. A system comprising:
a processor;
a display device in electrical communication with the processor;
a memory controller coupled with the processor; and
a memory coupled with the memory controller, the memory comprising:
a memory array;
a resistor coupled to a reference voltage;
on die termination circuitry coupled with the resistor; and
an input coupled to the on die termination circuitry and coupled with the memory array, the input to receive a first calibration command to calibrate the on die termination circuitry, the first calibration command having an associated first calibration time window, and a second calibration command to calibrate the on die termination circuitry, the second calibration command having an associated second calibration time window, wherein the first calibration time window is greater than the second calibration time window, and further wherein the memory array is quiesced responsive, at least in part, to the first calibration command.

12. The system of claim 11, comprising drive circuitry coupled with the memory array, the input to receive a calibration command to stop use of the input and the memory array and to calibrate the drive circuitry with the resistor coupled to the reference voltage.

13. The system of claim 11, wherein the memory array is a Dynamic Random Access Memory.

14. The system of claim 11, wherein the first calibration command is a ZQ calibration command and the resistor is a ZQ pin.

* * * * *